United States Patent
Sakata et al.

(10) Patent No.: US 7,938,930 B2
(45) Date of Patent: May 10, 2011

(54) SUPPORT BOARD SEPARATING APPARATUS, AND SUPPORT BOARD SEPARATING METHOD USING THE SAME

(75) Inventors: Masaki Sakata, Mie-ken (JP); Masayuki Yamamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 1398 days.

(21) Appl. No.: 11/389,122

(22) Filed: Mar. 27, 2006

(65) Prior Publication Data
US 2006/0231202 A1 Oct. 19, 2006

(30) Foreign Application Priority Data

Apr. 18, 2005 (JP) ................................ 2005-119707

(51) Int. Cl.
*B29C 63/00* (2006.01)
(52) U.S. Cl. .......... 156/344; 156/248; 156/584; 438/15; 438/464; 29/830; 324/754
(58) Field of Classification Search ................ 156/344, 156/248; 438/33, 464, 15; 29/830; 324/754
See application file for complete search history.

(56) References Cited

U.S. PATENT DOCUMENTS

| 6,627,037 | B1* | 9/2003 | Kurokawa et al. ............ 156/344 |
| 7,384,811 | B2* | 6/2008 | Miyamoto et al. .............. 438/33 |
| 7,393,757 | B2* | 7/2008 | Miyamoto et al. ........... 438/460 |
| 2003/0060021 | A1* | 3/2003 | Kurosawa et al. ............. 438/455 |
| 2003/0064592 | A1* | 4/2003 | Yamamoto .................... 438/689 |

FOREIGN PATENT DOCUMENTS

| JP | 2001-007179 A1 | 1/2001 |
| JP | 2005-39114 A | 2/2005 |

OTHER PUBLICATIONS

Notification of Reasons for Refusal for the Application No. 2005-119707 from Japan Patent Office mailed Mar. 17, 2009.

\* cited by examiner

*Primary Examiner* — Kat Wyrozebski
*Assistant Examiner* — Joshel Rivera
(74) *Attorney, Agent, or Firm* — Cheng Law Group, PLLC

(57) ABSTRACT

An aligned workpiece is mounted on and held by a holding table, and a support board separating mechanism separates a support board from a semiconductor wafer. Herein, a double-faced adhesive tape is left on one of the support board and the semiconductor wafer. Either the support board or the semiconductor wafer on which the double-faced adhesive tape is left is transported to an adhesive tape peeling mechanism while being held by the holding table, and the double-faced adhesive tape is peeled off and removed from the surface of thereof. The separated semiconductor wafer and support board are collected independently.

15 Claims, 11 Drawing Sheets

Fig.13
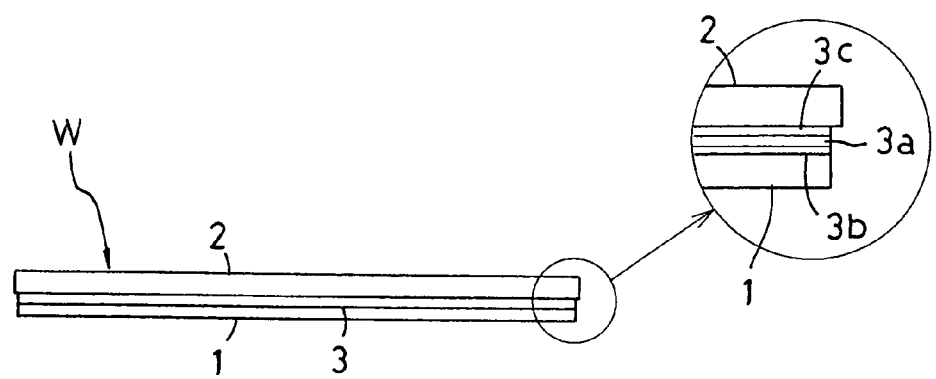
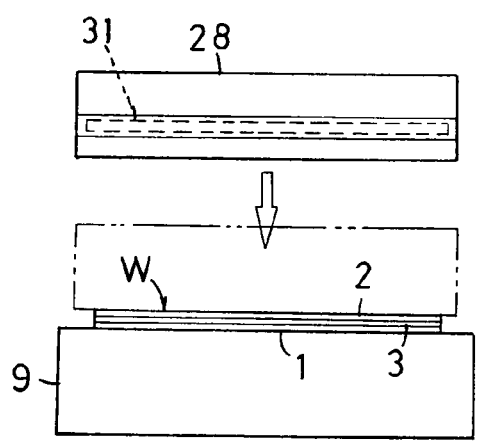
Fig.14A
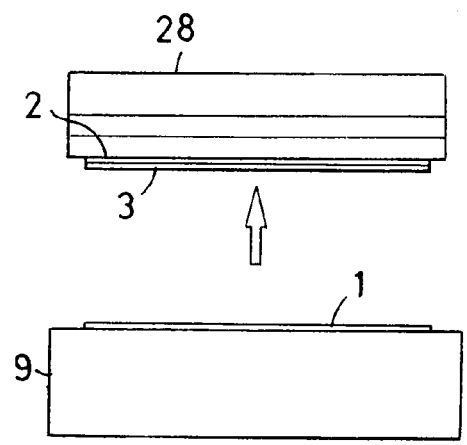
Fig.14B

SUPPORT BOARD SEPARATING APPARATUS, AND SUPPORT BOARD SEPARATING METHOD USING THE SAME

BACKGROUND OF THE INVENTION (1) Field of the Invention

The present invention relates to a support board separating apparatus for separating, from a semiconductor wafer, a support board such as a glass substrate held while being joined to the semiconductor wafer through a double-faced adhesive tape, and a support board separating method using the same.

(2) Description of the Related Art

Generally, a semiconductor wafer is subjected to a process for forming a circuit pattern of a large number of elements on a surface thereof, and then is subjected to a back grinding process for grinding or polishing a back face thereof so as to have a desired thickness. Thereafter, the semiconductor wafer is subjected to a dicing process for cutting it into plural elements.

In recent years, there has been demanded a thin semiconductor wafer as an application is rapidly progressed. A requested thickness of the semiconductor wafer is 100 µm to 50 µm, in some cases, about 25 µm. Such a thin semiconductor wafer is brittle and is readily bent; therefore, its handleability is extremely poor. In order to solve this problem, for example, a support board with high strength, such as a glass substrate, is joined to a surface of a semiconductor wafer through a double-faced adhesive sheet so as to hold the semiconductor wafer, and the semiconductor wafer is subjected to backing reinforcement with the use of the support board. Thereafter, a back face of the semiconductor wafer is subjected to a back grinding process. After completion of the process, the semiconductor wafer is separated from the support board.

Conventionally, JP-A 2001-7179 discloses a method for separating, from a semiconductor wafer, a support board joined to the semiconductor wafer through a double-faced adhesive sheet so as to hold the semiconductor wafer.

More specifically, a double-faced adhesive sheet to be used is of an ultraviolet-ray curable type in which its adhesion force is lowered by irradiation of ultraviolet rays. First, the adhesion force is previously lowered by irradiation of ultraviolet rays. Next, a semiconductor wafer is heated in a state that the semiconductor wafer is held and sucked by vacuum by upper and lower tables, and the double-faced adhesive sheet is allowed to contract and deform, so that a contact area between the double-faced adhesive sheet and the semiconductor wafer becomes small; thus, the semiconductor wafer is floated. Then, after end of the contraction and completion of peeling of the double-faced adhesive sheet, the suction by the upper table is released and the upper table is retreated upward. Thereafter, in a state that the semiconductor wafer is sucked by and fixed at the lower table, a holding member is moved while being sucked by a transporting arm; thus, the double-faced adhesive sheet is peeled off from the semiconductor wafer. Herein, in addition to the ultraviolet-ray curable double-faced adhesive sheet, a heat-peelable double-faced adhesive sheet may be used. The heat-peelable double-faced adhesive sheet is foamed by heating, so that its adhesion force is lowered.

The aforementioned separating method performs various processes for moving a table suction-holding a workpiece along a long movement path to thereby separate a member such as a support board from a semiconductor wafer. Therefore, the size of an apparatus is increased and, also, it takes much time to stably move a table over respective processing sections. Consequently, there arises a problem that it is difficult to efficiently separate and collect a semiconductor wafer and a support board.

SUMMARY OF THE INVENTION

The present invention has been made in view of the aforementioned circumstances, and it is therefore an object of the present invention to provide a support board separating apparatus with a simple configuration, capable of efficiently performing separation and collection of a support board and a semiconductor wafer, and a support board separating method using the same.

In order to achieve the aforementioned object, the present invention adopts the following configuration.

An apparatus for separating, from a semiconductor wafer, a support board joined to the semiconductor wafer through a double-faced adhesive tape, the apparatus comprising:

aligning means for aligning the semiconductor wafer to which the support board is joined;

holding means on and by which the aligned semiconductor wafer is mounted and held;

separating means for separating the support board from the semiconductor wafer mounted on and held by the holding means;

peeling means for peeling off and removing the double-faced adhesive tape left on either a surface of the support board separated by separating means or a surface of the semiconductor wafer;

a wafer collecting section for collecting the semiconductor wafer that has been subjected to the peeling process by the peeling means;

a support board collecting section for collecting the separated support board;

a first transporting robot capable of turning the held support board upside down when transporting the semiconductor wafer to the aligning means and the separating means and, also, transporting the separated support board to the holding means and the support board collecting section; and a second transporting robot for holding and transporting the semiconductor wafer that has been subjected to the peeling process.

The apparatus according to the present invention can separate a support board from a semiconductor wafer as follows.

First, a semiconductor wafer to which a support board is joined and which is subjected to a back grinding process is aligned by the aligning means and, then, is mounted on and held by the holding means such as a holding table. Next, the separating means separates the support board from the semiconductor wafer on the holding means.

In this case, a double-faced adhesive tape is left on either a surface of the semiconductor wafer or a surface of the support board. Next, this double-faced adhesive tape is peeled off and removed by the peeling means.

Then, the separated support board is fed to the support board collecting section by the first transporting robot, and the separated semiconductor wafer is fed to the wafer collecting section by the second transporting robot.

Accordingly, this apparatus can efficiently perform separation and collection of a semiconductor wafer and collection of a support board with a simple configuration that two transporting robots are effectively used.

Preferably, the holding means is configured to move to a peeling position of the peeling means while holding the separated semiconductor wafer or support board.

With this configuration, the separated semiconductor wafer or support board can be fed to the peeling position as it is. Therefore, it is possible to simplify handling and to improve processing efficiency. Further, a semiconductor wafer can be transported while being corrected in a flat state during a period from separation of a support board until peeling of a double-faced adhesive tape.

Preferably, the second transporting robot includes a Bernoulli chuck for transporting the semiconductor wafer in a non-contact manner with the use of a negative pressure generated by a difference between air blown on the surface of the semiconductor wafer and an atmospheric pressure.

With this configuration, a semiconductor wafer from which a support board is separated can be held in a non-contact manner without being damaged from its surface side and can be fed to the wafer collecting section. Further, it is unnecessary to turn the semiconductor wafer upside down and shift the semiconductor wafer. As a result, it is possible to simplify handing and to improve processing efficiency. In addition, since the semiconductor wafer is held in a state that a negative pressure is evenly acted on the surface of the semiconductor wafer, warpage of the semiconductor wafer can be corrected.

Preferably, the support board is a transparent substrate, the double-faced adhesive tape includes a base material and adhesion layers at least one of which is of an ultraviolet-ray curable type, and the apparatus further comprises ultraviolet-ray irradiating means for irradiating, with ultraviolet rays, the support board joined to the semiconductor wafer through the double-faced adhesive tape.

With this configuration, an ultraviolet-ray curable adhesion layer of a double-faced adhesive tape is irradiated with ultraviolet rays through a support board so as to be cured. As a result, it is possible to positively lower an adhesion force of the double-faced adhesive tape in a shorter time, which contributes to improvement of processing efficiency. Further, in a case that the ultraviolet-ray curable adhesion layer is joined to the surface of the semiconductor wafer, the adhesion layer can be peeled off and removed from the semiconductor wafer without a residue of an adhesive.

Herein, the following double-faced adhesive tapes can be used. Preferably, means for separation and peeling of a support board is changed in accordance with the type of a double-faced adhesive tape to be used.

First, a support board is a transparent substrate, a double-faced adhesive tape includes a base material, an ultraviolet-ray curable adhesion layer provided on one side of the base material and cured at a predetermined wavelength of ultraviolet rays, and an ultraviolet curable adhesion layer provided on the other side of the base material and cured at a different wavelength from the predetermined wavelength, and the apparatus further comprises ultraviolet-ray irradiating means for curing the respective adhesion layers of the double-faced adhesive tape.

Second, a support board is a transparent substrate, a double-faced adhesive tape includes an ultraviolet ray curable adhesion layer to be joined to the support board, and a heat-peelable adhesion layer to be joined to a semiconductor layer and having an adhesion force lowered by heating, and the apparatus further comprises: ultraviolet-ray irradiating means for irradiating, with ultraviolet rays, the support board joined to the semiconductor wafer through the double-faced adhesive tape; and heating means for heating the heat-peelable adhesion layer.

Third, a double-faced adhesive tape includes a base material, a heat-peelable adhesion layer provided on one side of the base material and having an adhesion force lowered at a predetermined temperature, and a heat-peelable adhesion layer provided on the other side of the base material and having an adhesion force lowered at a different temperature from the predetermined temperature, and the apparatus further comprises heating means for heating the heat-peelable adhesion layer.

In order to achieve the aforementioned object, the present invention also adopts the following configuration.

A method using the aforementioned apparatus, comprising:

a first transporting step of suction-holding a semiconductor wafer joined to a support board through a double-faced adhesive tape including a base material and adhesion layers provided on both sides of the base material with the use of the first transporting robot, and transferring the semiconductor wafer to the aligning means;

an aligning step of aligning the semiconductor wafer with the use of the aligning means;

a second transporting step of transferring the aligned semiconductor wafer to the holding means with the use of the first transporting robot;

a separating step of separating the support board from the semiconductor wafer held by the holding means while the double-faced adhesive tape is left on a surface of the semiconductor wafer;

a third transporting step of suction-holding, with the use of the first transporting robot, a bottom face of the support board separated while being turned upside down, and transporting and storing the support board to and in the support board collecting section;

a fourth transporting step of moving the semiconductor wafer separated from the support board to a peeling position of the peeling means while the semiconductor wafer is held by the holding means;

a peeling step of joining a peeling tape to the surface of the base material and, then, peeling off the peeling tape with the use of the peeling means, thereby peeling off the double-faced adhesive tape together with the peeling tape from the surface of the semiconductor wafer; and a fifth transporting step of holding the semiconductor wafer from which the double-faced adhesive tape is peeled off with the use of the second transporting robot in a non-contact manner, thereby transporting and storing the semiconductor wafer to and in the wafer collecting section.

With this method, the aforementioned apparatus can be suitably functioned.

This method may adopt the following modes.

First, a support board is a transparent substrate, and the method further comprises an ultraviolet-ray irradiating step of irradiating the substrate with ultraviolet rays with the use of the ultraviolet-ray irradiating means prior to the separating step.

Second, in the separating step, further, the adhesion layers of the double-faced adhesive tape are heated by the heating means.

Third, a support board is a transparent substrate, the method further comprises an ultraviolet-ray irradiating step of irradiating the substrate with ultraviolet rays with the use of the ultraviolet-ray irradiating means prior to the separating step, and in the separating step, the adhesion layers of the double-faced adhesive tape are heated by the heating means.

In the case of the first mode, an ultraviolet-ray curable adhesion layer of a double-faced adhesive tape is irradiated with ultraviolet rays through a support board so as to be cured. As a result, it is possible to positively lower an adhesion force of the double-faced adhesive tape in a shorter time, which contributes to improvement of processing efficiency.

In order to achieve the aforementioned object, the present invention also adopts the following configuration.

A method using the aforementioned apparatus, comprising:

a first transporting step of suction-holding a semiconductor wafer joined to a support board through a double-faced adhesive tape including a base material and adhesion layers provided on both sides of the base material with the use of the first transporting robot, and transferring the semiconductor wafer to the aligning means;

an aligning step of aligning the semiconductor wafer with the use of the aligning means;

a second transporting step of transferring the aligned semiconductor wafer to the holding means with the use of the first transporting robot;

a separating step of separating the support board from the semiconductor wafer in a state that the double-faced adhesive tape is left on the support board;

a third transporting step of suction-holding, with the use of the first transporting robot, a top face of the support board separated and turning the support board upside down, thereby transporting and storing the support board to and in the support board collecting section in a state that the side to which the double-faced adhesive tape is directed upward;

a fourth transporting step of moving the semiconductor wafer separated from the support board to a peeling position of the peeling means while the semiconductor wafer is held by the holding means;

a fifth transporting step of holding the semiconductor wafer transported to the peeling means with the use of the second transporting robot in a non-contact manner and transporting and storing the semiconductor wafer to and in the wafer collecting section;

a returning step of allowing the holding means to which the semiconductor wafer is transported to return to the position of the separating means;

a sixth transporting step of taking out the support board stored in the support board collecting section in such a manner that the first transporting robot suction-holds the bottom face of the support board, and transferring the support board to the returned holding means in a state that the adhesion face thereof is directed upward;

a seventh transporting step of moving the support board to the peeling position of the peeling means while the support board is held by the holding means;

a peeling step of joining a peeling tape to the double-faced adhesive tape left on the support board, and peeling off the peeling tape with the use of the peeling means, thereby peeling off the double-faced adhesive tape together with the peeling tape from the support board;

an eighth transporting step of allowing the holding means to return to the position of the separating means while the holding means holds the support board from which the double-faced adhesive tape is peed off; and a ninth transporting step of suction-holding the support board held by the holding means returned to the position of the separating means with the use of the first transporting robot, thereby transporting and storing the support board to and in the support board collecting section.

With this method, since a semiconductor wafer can be immediately separated into a single piece by separation of a support board, it is unnecessary to perform a process for peeling off the double-faced adhesive tape from the semiconductor wafer.

Accordingly, the semiconductor wafer receives no external forces generated upon joining of a peeling tape and upon peeling of the peeling tape. As a result, it is possible to efficiently collect the semiconductor wafer without being damaged and bent. Herein, since the support board can be optionally configured to have a higher strength than that of the semiconductor wafer, no problem arises even when a comparatively large external force is applied upon joining of the peeling tape and upon peeling of the peeling tape. Further, a peeling process at high speed can be performed without problems. In addition, the support board can be made reusable in the apparatus. Therefore, it is unnecessary to transfer only the support board to an independent site where a process for reuse is performed.

Herein, this method may adopt the following modes.

First, a support board is a transparent substrate, and the method further comprises an ultraviolet-ray irradiating step of irradiating the substrate with ultraviolet rays with the use of the ultraviolet-ray irradiating means prior to the separating step.

Second, in the separating step, further, the adhesion layers of the double-faced adhesive tape are heated by the heating means.

Third, the support board is a transparent substrate, the method further comprises an ultraviolet-ray irradiating step of irradiating the substrate with ultraviolet rays with the use of the ultraviolet-ray irradiating means prior to the separating step, and in the separating step, the adhesion layers of the double-faced adhesive tape are heated by the heating means.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 13 is a side view of a workpiece in a second embodiment;

FIGS. 14A and 14B are front views schematically illustrating procedures of separation of a support board in the second embodiment;

DESCRIPTION OF THE PREFERRED EMBODIMENTS

Hereinafter, description will be given of embodiments of the present invention with reference to the drawings.

First Embodiment

Figure 7:
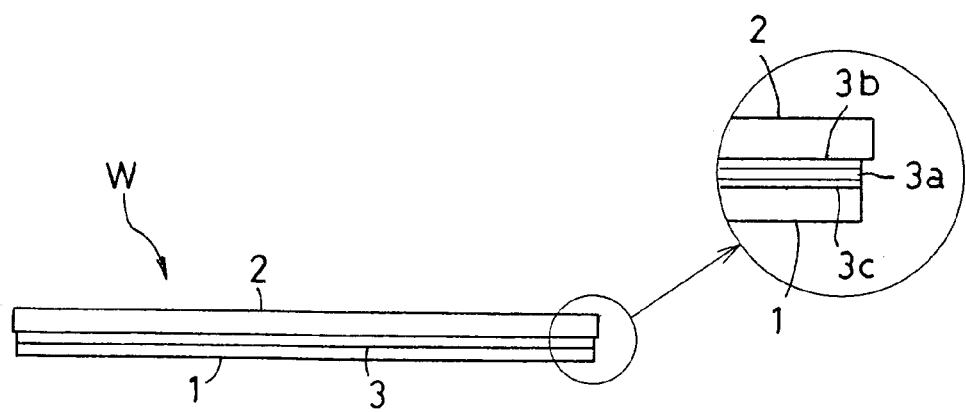
FIG. 7 is a side view of a workpiece in which a support board is joined to a semiconductor wafer.

FIG. 7 illustrates a workpiece W in which a support board 2 made of a transparent glass substrate is joined to an element formation face (surface) of a semiconductor wafer 1 through a double-faced adhesive tape 3. Accordingly, a back face of the semiconductor wafer 1, subjected to backing reinforcement with the support board 2, is ground so as to have a desired thickness in a back grinding process. Thereafter, the semiconductor wafer 1 ground to be thin is separated from the double-faced adhesive tape 3 and, then, is transferred to a subsequent process.

Herein, the double-faced adhesive tape 3 includes a base material 3a, a heat-peelable adhesion layer 3b provided on one side of the base material 3a and foamed and expanded by heating to thereby lose its adhesion force, and an ultraviolet-ray curable adhesion layer 3c cured by irradiation of ultraviolet rays so that its adhesion force is lowered. That is, the support board 2 is joined to the heat-peelable adhesion layer 3b of the double-faced adhesion tape 3, and the semiconductor wafer 1 is joined to the ultraviolet-ray curable adhesion layer 3c.

Next, with reference to FIGS. 1 to 6, description will be given of an apparatus for splitting the workpiece W subjected to the back grinding process into the semiconductor wafer 1 and the support board 2.

Figure 1:
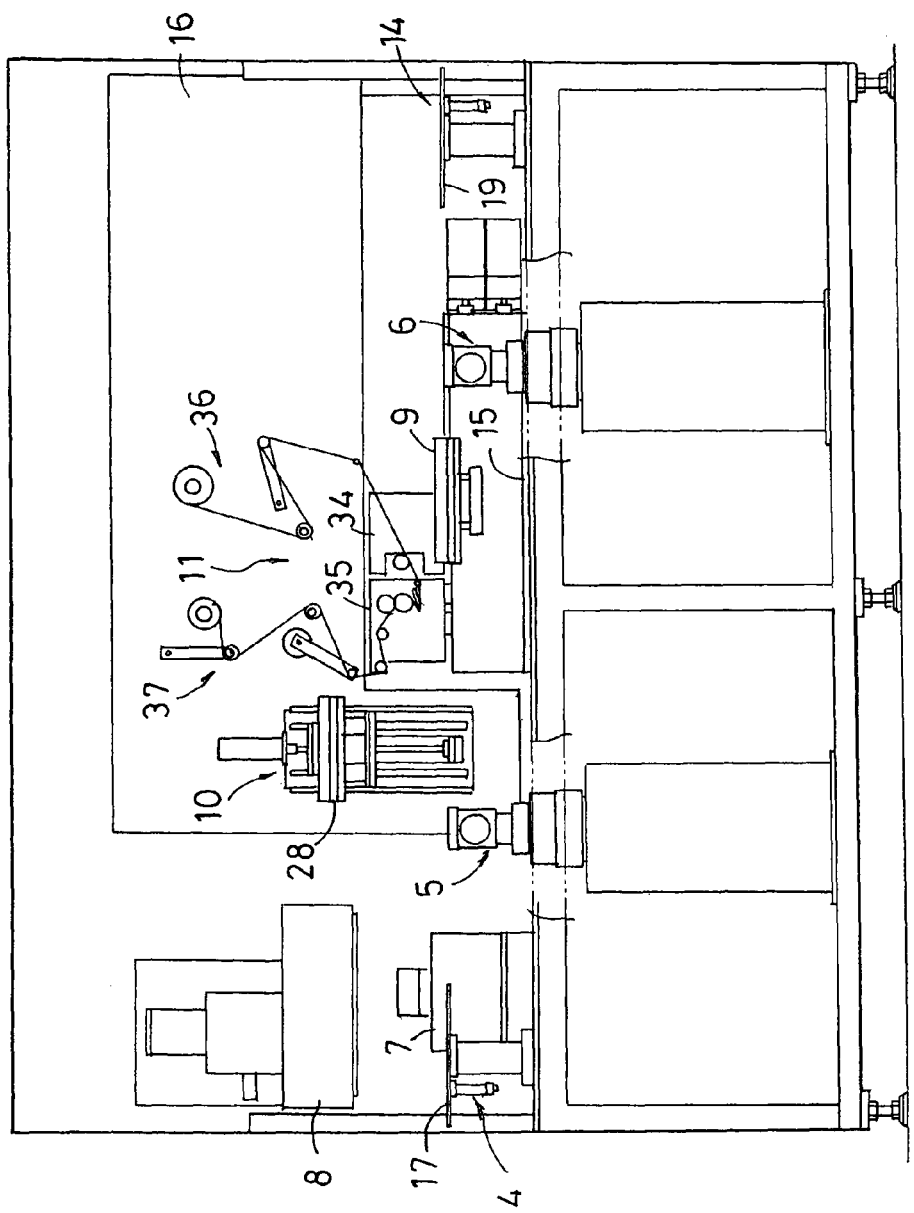
FIG. 1 is a front view of a support board separating apparatus.
Figure 2:
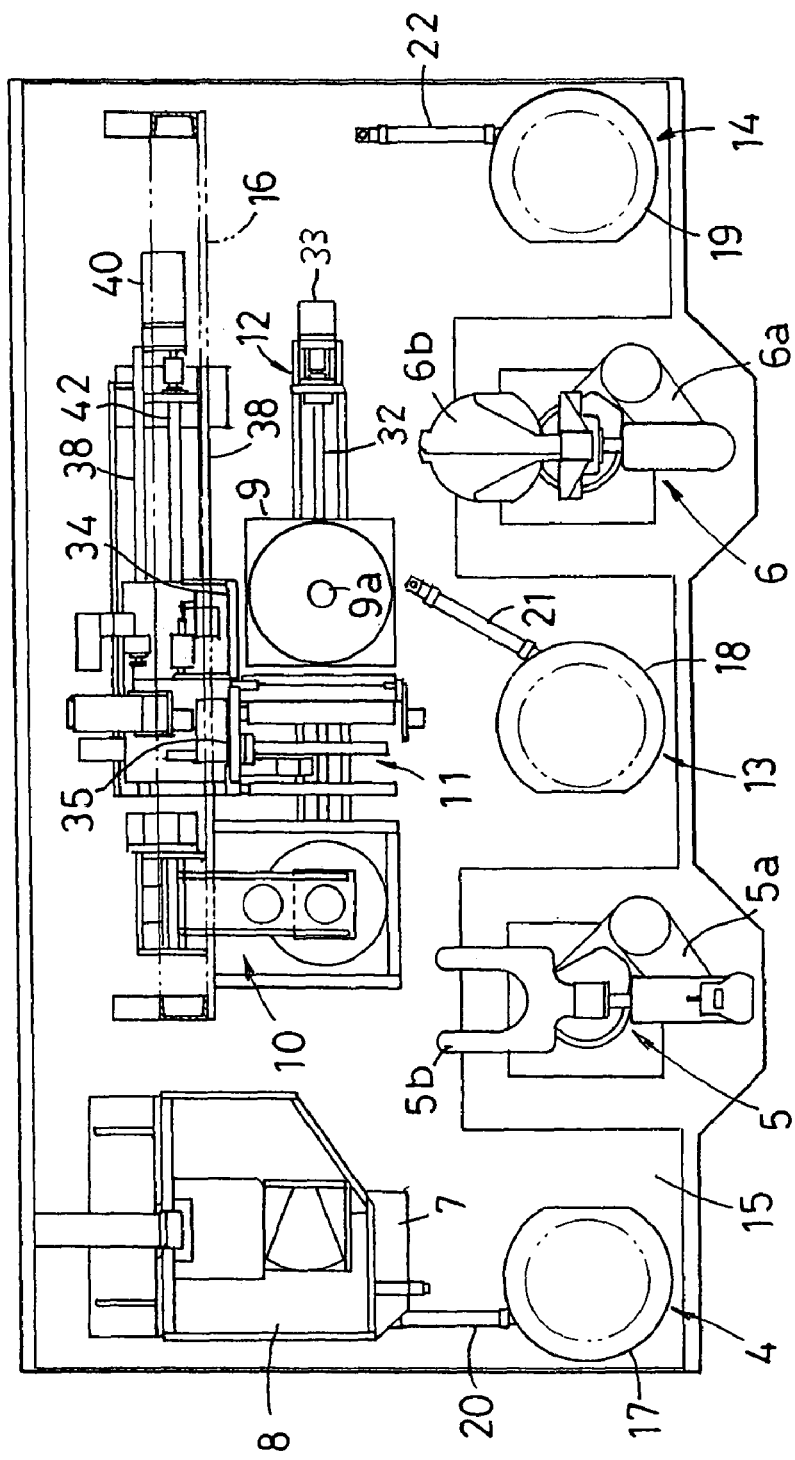
FIG. 2 is a plan view of the support board separating apparatus.
Figure 3:
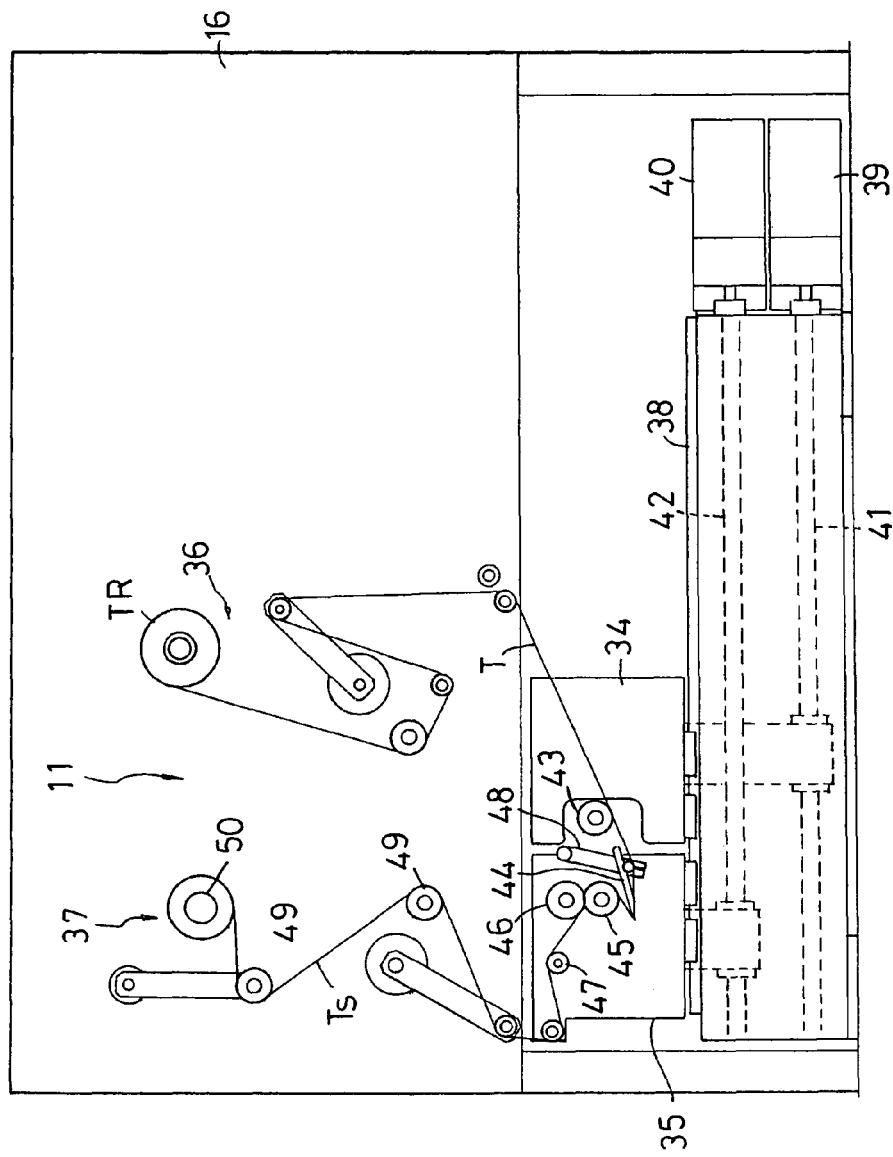
FIG. 3 is a front view illustrating an adhesive tape peeling mechanism.

FIG. 1 is a front view illustrating an overall configuration of a support board separating apparatus according to the present invention. FIG. 2 is a plan view of the support board separating apparatus. FIG. 3 is a front view of adhesive tape peeling means.

This support board separating apparatus comprises a workpiece supplying section 4, a first transporting robot 5, a second transporting robot 6, an alignment stage 7, an ultraviolet-ray irradiating device 8, a holding table 9, a support board separating mechanism 10, an adhesive tape peeling mechanism 11, a table driving mechanism 12, a support board collecting section 13 and a wafer collecting unit 14. Herein, workpieces W subjected to a back grinding process are stored in a cassette (not illustrated) in a stacked manner and the cassette is loaded into the workpiece supplying section 4. The first and second transporting robots 5 and 6 rotate in a bendable manner. The alignment stage 7 aligns the workpiece W. The ultraviolet-ray irradiating device 8 irradiates the workpiece W on the alignment stage 7 with ultraviolet rays. The aligned workpiece W is mounted on and held by the holding table 9. The support board separating mechanism 10 separates a support board 2 from a semiconductor wafer 1 on the holding table 9. The adhesive tape peeling mechanism 11 peels off and removes a double-faced adhesive tape 3 from the semiconductor wafer 1 from which the support board 2 is separated. The table driving mechanism 12 allows the holding table 9 to reciprocate in a lateral direction between the support board separating mechanism 10 and the adhesive tape peeling mechanism 11. In the support board collecting section 13, the separated support boards 2 are stored in a cassette (not illustrated) in a stacked manner. In the wafer collecting section 14, the separated semiconductor wafers 1 are stored in a cassette (not illustrated) in a stacked manner. Herein, the alignment stage 7, the ultraviolet-ray irradiating device 8, the holding table 9 and the support board separating mechanism 10 correspond to aligning means, ultraviolet-ray irradiating means, holding means and separating means according to the present invention, respectively.

The workpiece supplying section 4, the first transporting robot 5, the second transporting robot 6, the alignment stage 7, the holding table 9, the support board separating mechanism 10, the adhesive tape peeling mechanism 11, the support board collecting section 13 and the wafer collecting section 14 are disposed forward a vertical wall 16 erected at a position on an upper back side of an apparatus base 15. In addition, a processing part of the adhesive tape peeling mechanism 11 is provided so as to face a lower opening of the vertical wall 16. Further, a driving part of the support board separating mechanism 10 and that of the adhesive tape peeling mechanism 11 are disposed on a back of the vertical wall 16.

The workpiece supplying section 4, the support board collecting section 13 and the wafer collecting section 14 are provided with cassette benches 17, 18 and 19, respectively. The cassette benches 17, 18 and 19 are turned by expansion/contraction of air cylinders 20, 21 and 22, respectively, so as to change their directions.

Figure 4:
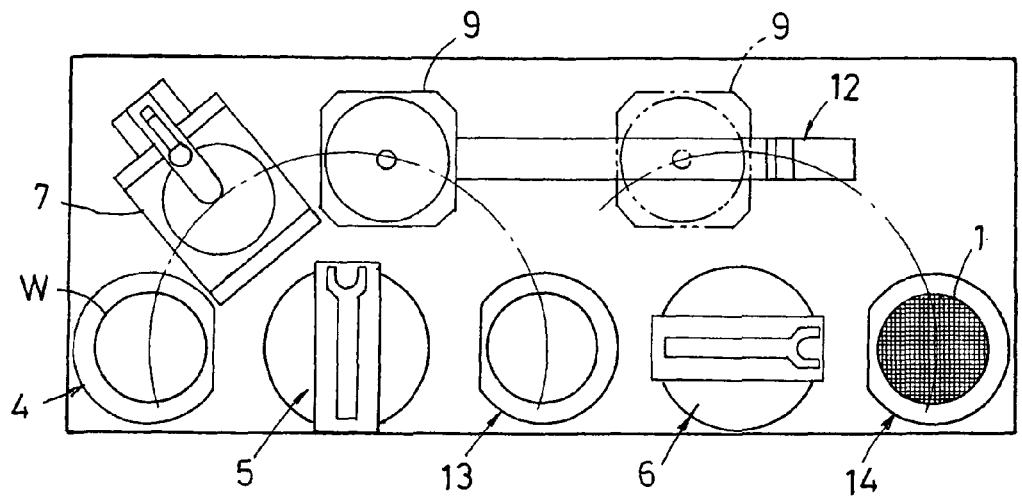
FIG. 4 is a plan view illustrating a positional relation between a processing section and a transporting robot in the support board separating apparatus.
Figure 5:
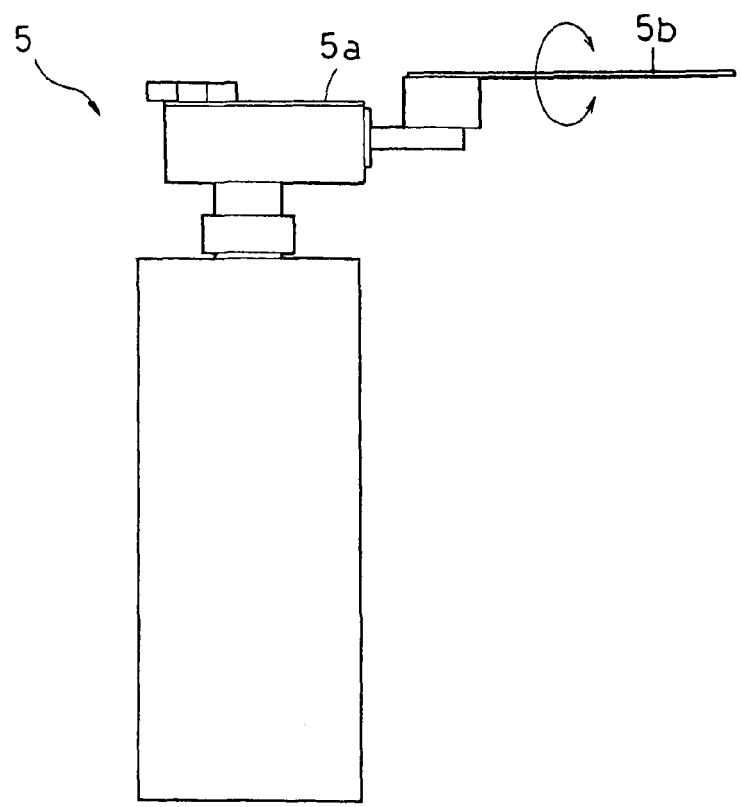
FIG. 5 is a side view of a first transporting robot.

The first transporting robot 5 has an arm 5a capable of advancing/retreating in a horizontal direction and turning by a bending/stretching motion, and a suction head 5b provided at a tip end of the arm 5a and sucking the workpiece W by vacuum. As illustrated in FIG. 4, the first transporting robot 5 takes out the workpiece W from the workpiece supplying section 4, supplies the workpiece W to the alignment stage 7, delivers the workpiece W from the alignment stage 7 to the holding table 9, receives the support board 2 from the support board separating mechanism 10, and delivers the received support board 2 to the support board collecting section 13. As illustrated in FIG. 5, the suction head 5b of the first transporting robot 5 rotates so as to be turned upside down, so that a suction face thereof can be directed upward or downward.

The second transporting robot 6 has an arm 6a capable of advancing/retreating in a horizontal direction and turning by a bending/stretching motion, and a suction head 6b provided at a tip end of the arm 6a and sucking a target to be transported by a negative pressure. The second transporting robot 6 receives the semiconductor wafer 1 from the holding table 9, and delivers the received semiconductor wafer 1 to the wafer collecting section 14. The suction head 6b of the second transporting robot 6 utilizes a Bernoulli chuck for sucking and transporting the semiconductor wafer 1 in a non-contact manner with the use of a negative pressure generated by a difference between air blown on the surface of the semiconductor wafer 1 and an atmospheric pressure.

Figure 6:
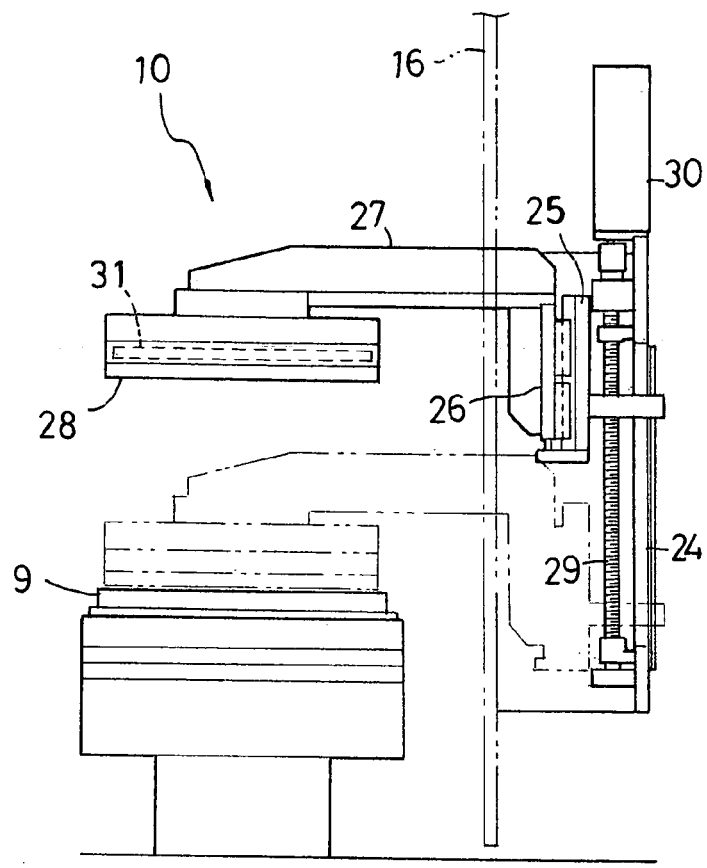
FIG. 6 is a side view illustrating a support board separating mechanism.

As illustrated in FIG. 6, the support board separating mechanism 10 includes a movable stage 25, a movable frame 26, a suction plate 28 and the like. Herein, the movable stage 25 is movable upward/downward along rails 24 provided on the back of the vertical wall 16 in the vertical direction. The movable frame 26 is supported by the movable stage 25 in a height adjustable manner. The suction plate 28 is attached to a tip end of an arm 27 extending forward from the movable frame 26. The movable stage 25 moves upward/downward when a threaded shaft 29 is screwed in a clockwise/counterclockwise direction by a motor 30. The suction plate 28 has a bottom face that is a vacuum suction face, and incorporates therein a heater 31. Herein, the heater 31 corresponds to heating means according to the present invention.

At a center of the holding table 9, as illustrated in FIG. 2, there is provided a suction pad 9a having a top face that is a vacuum suction face, in such a manner that the suction pad 9a can protrude, retreat, move upward and move downward. The top face of the holding table 9 is; a vacuum suction face for holding the mounted workpiece W without misalignment.

The table driving mechanism 12 has the following configuration. That is, a threaded shaft 32 is screwed in a clockwise/counterclockwise direction by a motor 33, so that the holding table 9 reciprocates between a position immediately below the support board separating mechanism 10 and a predetermined peeling position in the adhesive tape peeling mechanism 11.

Figure 9:
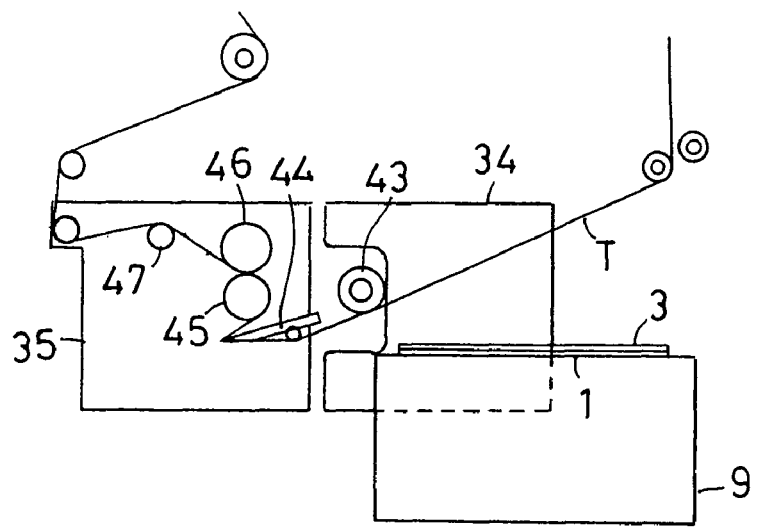
FIG. 9 is a front view illustrating a step of peeling off a double-faced adhesive tape.

As illustrated in FIGS. 3 and 9, the adhesive tape peeling mechanism 11 includes a joining unit 34, a peeling unit 35, a tape supplying section 36 and a tape collecting section 37.

The joining unit 34 and the peeling unit 35 are supported so as to be slidable in a lateral direction along rails 38. Further, the joining unit 34 and the peeling unit 35 independently move in a horizontal direction when threaded shafts 41 and 42 are screwed in a clockwise/counterclockwise direction by motors 39 and 40, respectively. The joining unit 34 is equipped with a joining roller 43 to be movable in a vertical direction. The peeling unit 35 is equipped with an edge member 44, a feed roller 45 to be driven and rotated, a nip roller 46 opposing the feed roller 45, and a guide roller 47.

As illustrated in FIG. 3, the tape supplying section 36 guides a peeling tape T derived from a tape roll TR to the joining unit 34 and the peeling unit 35 via a portion above the holding table 9. Herein, the peeling tape T to be used has a diameter narrower than that of the semiconductor wafer 1. The edge member 44 has a sharp edge at its tip end and is made of a plate-like material having a width larger than that of the semiconductor wafer 1. Further, the edge member 44 is coupled and fixed to a tip end of a support arm 48 swingably disposed on a front face of the peeling unit 35, and the edge is adjustable in height by adjusting the swing motion of the support arm 48.

The tape collecting section 37 has the following configuration. That is, a processed peeling tape Ts fed from the peeling unit 35 is guided by a guide roller 49 and, then, is wound around and collected by a bobbin 50.

The respective components of the support board separating apparatus according to the present invention are configured as described above. Hereinafter, description will be given of basic procedures for splitting a workpiece W into a support board 2 and a semiconductor wafer 1 and, then, collecting the support board 2 and the semiconductor wafer 1, respectively.

First, the first transporting robot 5 suction-holds one workpiece W in which a semiconductor wafer 1 is joined to a support board 2 through a double-faced adhesive tape 3 and, then, takes out the workpiece W from the cassette of the workpiece supplying section 4. Next, the first transporting robot 5 transfers the workpiece W onto the alignment stage 7 in which alignment for the workpiece W is performed on the basis of detection of an orientation flat or a notch of the semiconductor wafer 1. In addition, the ultraviolet-ray irradiating device 8 irradiates a top face of the workpiece W with ultraviolet rays. In this case, the workpiece W is supplied in such a posture that the support board 2 made of a glass substrate is directed upward, i.e., the semiconductor wafer 1 is directed downward. Therefore, the ultraviolet rays transmit through the support board 2 and reach the double-faced adhesive tape 3, so that an ultraviolet-ray curable adhesion layer 3c is cured and its adhesion force is lowered.

After completion of the alignment and the irradiation of ultraviolet rays, the workpiece W is again suction-held by the first transporting robot 5 and, then, is supplied onto the holding table 9 which is on standby at a position immediately below the support board separating mechanism 10. The workpiece W transported onto the holding table 9 is once received by the suction pad 9a protruding from the holding table 9 in such a state that the semiconductor wafer 1 is directed to the suction pad 9a. Thereafter, as the suction pad 9a moves downward, the workpiece W is mounted on the top face of the holding table 9 in a predetermined posture at a predetermined position and, then, is suction-held by the holding table 9.

Figure 8A:
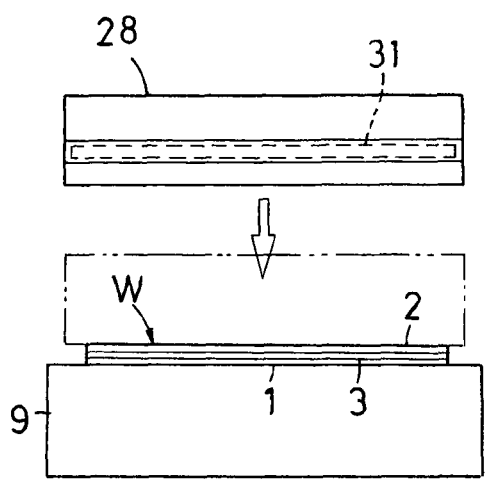
FIGS. 8A to 8D are front views schematically illustrating procedures from separation of a support board until peeling of a double-faced adhesive tape.

Next, as illustrated in FIG. 8A, the suction plate 28 of the support board separating mechanism 10 moves downward so as to come into contact with the top face of the workpiece W, and the heater 31 incorporated therein heats the workpiece W. With this heating operation, a heat-peelable adhesion layer 3b of the double-faced adhesive tape 3 is foamed and expanded, and its adhesion force becomes lost.

Figure 8B:
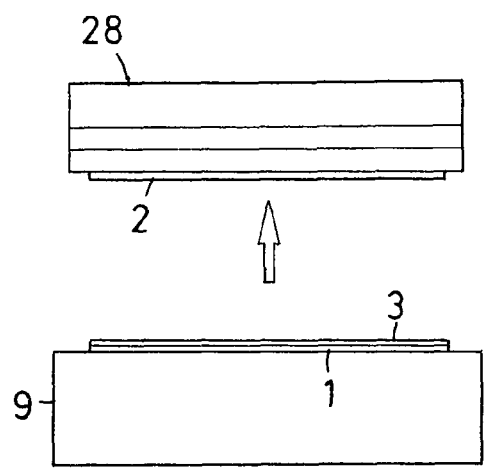

After completion of the heating operation for a predetermined time, as illustrated in FIG. 8B, the suction plate 28 moves upward while suction-holding the support board 2. Herein, the adhesion layer 3b having no adhesion force is separated from the bottom face of the support board 2, and only the support board 2 is moved upward. Thereafter, the separated support board 2 is received by the first transporting robot 5 with the suction head 5b directed upward, and the first transporting robot 5 transports the support board 2 to the support board collecting section 13. During this transporting operation, the suction head 5b is directed downward, and the support board 2 is inserted into and stored in the cassette of the support board collecting section 13.

Figure 8C:
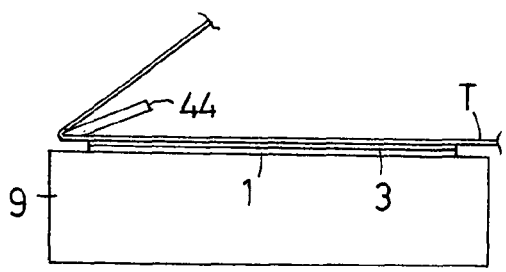
Figure 8D:
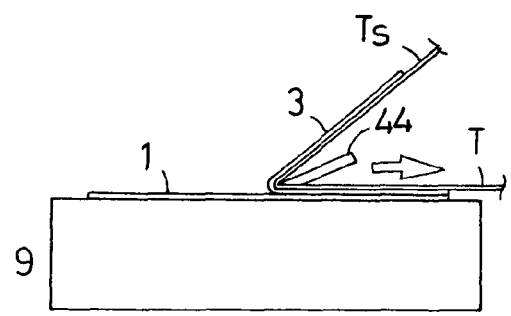

After completion of the support board separating process, the holding table 9 holds the semiconductor wafer 1 on which the double-faced adhesive tape 3 is left. The holding table 9 on and by which the semiconductor wafer 1 is mounted and held is moved to a predetermined peeling position of the adhesive tape peeling mechanism 11. Herein, as illustrated in FIG. 8C, a peeling tape T is joined to the double-faced adhesive tape 3 left on the top face of the semiconductor wafer 1. Thereafter, as illustrated in FIG. 8D, the double-faced adhesive tape 3 is peeled off together with the peeling tape T from the semiconductor wafer 1.

FIGS. 9 to 12 illustrate peeling operations of the adhesive tape peeling mechanism 11 using the peeling tape T.

As illustrated in FIG. 9, at the time when the holding table 9 moves to a position for a peeling process, the joining unit 34 and the peeling unit 35 are on standby at their initial positions.

Figure 10:
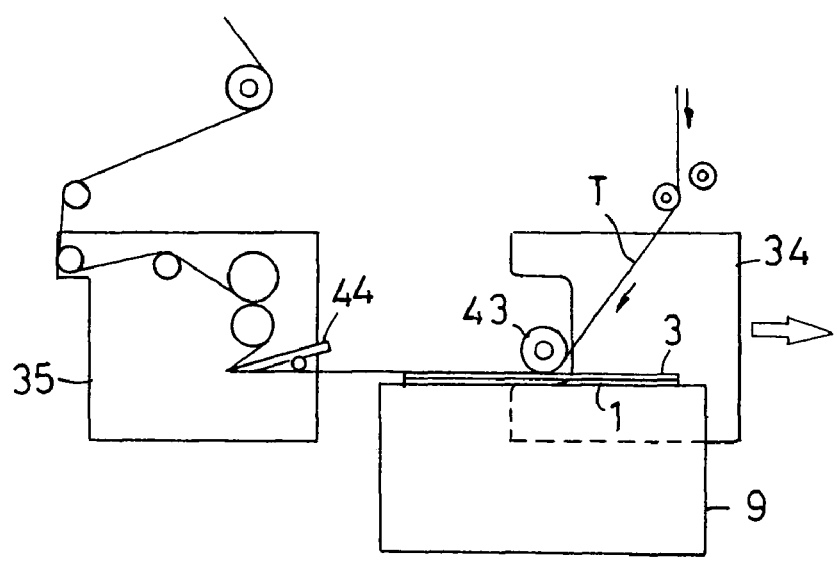
FIG. 10 is a front view illustrating a step of peeling off the double-faced adhesive tape.
Figure 11:
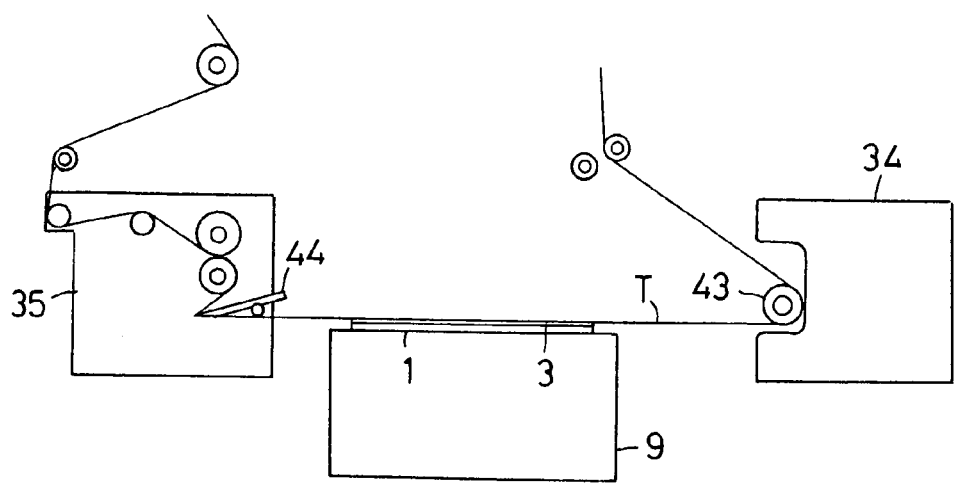
FIG. 11 is a front view illustrating a step of peeling off the double-faced adhesive tape.

When the holding table 9 reaches the peeling position, as illustrated in FIG. 10, the joining roller 43 moved downward presses the peeling tape T against the double-faced adhesive tape 3 and, simultaneously, the joining unit 34 moves forward. Then, as illustrated in FIG. 11, the joining unit 34 further moves forward while joining the peeling tape T to the top face of the double-faced adhesive tape 3, and stops at a predetermined position.

Figure 12:
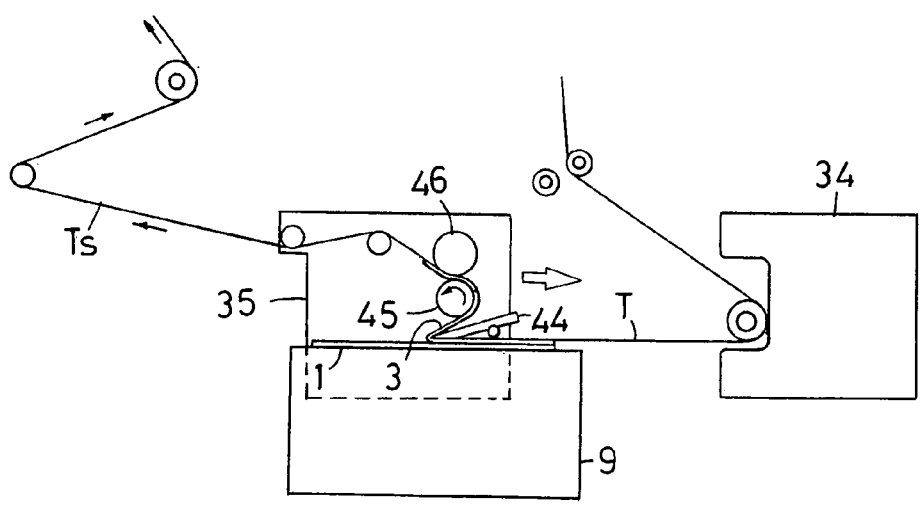
FIG. 12 is a front view illustrating a step of peeling off the double-faced adhesive tape.

Next, as illustrated in FIG. 12, the peeling unit 35 moves forward while the edge member 44 is pressed against the double-faced adhesive tape 3 and, simultaneously, the feed roller 45 is driven and rotated at a peripheral speed which is in synchronization with a speed at which the peeling unit 35 moves. With this operation, the peeling tape T is moved while being folded back at the tip end of the edge member 44. Herein, the double-faced adhesive tape 3 having an adhesion force lowered by irradiation of ultraviolet rays is peeled off together with the peeling tape T from the surface of the semiconductor wafer 1.

When the double-faced adhesive tape 3 is completely peeled off from the surface of the semiconductor wafer 1, the semiconductor wafer 1 is transported by the second transporting robot 6 from the holding table 9 and, then, is inserted into and stored in the cassette of the wafer collecting section 14. In this case, since a Bernoulli chuck is employed as the suction head 6b of the second transporting robot 6, the top face of the semiconductor wafer 1 is suction-held by the suction head 6b in a non-contact manner. In other words, the semiconductor wafer 1 is transported while being corrected in a flat state with its surface not being damaged.

Thereafter, the joining unit 34 and the peeling unit 35 retreat, return and move to their original standby positions and, also, the separated, processed peeling tape Ts is collected.

Thus, a series of procedures for separating and collecting the support board 2 and the semiconductor wafer 1 is completed, and the support board separating apparatus enters a standby state for accepting a next workpiece.

With the support board separating apparatus according to this embodiment, the semiconductor wafer 1 from which the support board 2 is separated and which has lowered rigidity can be transported to the peeling position of the adhesive tape peeling mechanism 11 as it is while the semiconductor wafer 1 is suction-held by the holding table 9. Accordingly, it is possible to transport the semiconductor wafer 1 with good accuracy without generation of bending. In addition, the semiconductor wafer 1 from which the double-faced adhesive tape 3 is peeled off by the adhesive tape peeling mechanism 11 is transported with the use of a Bernoulli chuck in a non-contact manner, so that the warpage of the semiconductor wafer 1 can be corrected and the semiconductor wafer 1 can be flattened. Further, two transporting robots 5 and 6 are efficiently used, so that the semiconductor wafer 1 and the support board 2 can be separated and collected efficiently.

Second Embodiment

In the aforementioned embodiment, after separation of the support board 2, the double-faced adhesive tape 3 is peeled off from the semiconductor wafer 1. In this embodiment, the double-faced adhesive tape 3 is left on the support board 2, and peeled off by the adhesive tape peeling mechanism 11.

More specifically, as illustrated in FIG. 13, in this embodiment, a workpiece W is configured as follows. That is, a semiconductor wafer 1 is joined to a heat-peelable adhesion layer 3b of a double-faced adhesive tape 3, and a support board 2 is joined to an ultraviolet-ray curable adhesion layer 3c of the double-faced adhesive tape 3. Then, the workpiece W is supplied to the workpiece supplying section 4 in such a posture that the semiconductor wafer 1 is directed downward.

Then, the first transporting robot 5 suction-holds one workpiece W, takes out the workpiece W from the cassette of the workpiece supplying section 4, and transfers the workpiece W onto the alignment stage 7 in which the alignment of the workpiece W is performed. When the ultraviolet-ray irradiating device 8 irradiates the top face of the workpiece W with ultraviolet rays, the ultraviolet-ray curable adhesion layer 3c of the double-faced adhesive tape 3 is cured, and its adhesion force is lowered.

After completion of the alignment and the irradiation of ultraviolet rays, the workpiece W is again supported by the first transporting robot 5, is supplied onto the holding table 9 which is on standby at a position immediately below the support board separating mechanism 10, and is mounted on and held by the holding table 9 in a predetermined posture at a predetermined position. Herein, the holding table 9 correspond to holding means according to the present invention.

Next, as illustrated in FIG. 14A, the suction plate 28 of the support board separating mechanism 10 moves downward so as to come into contact with the top face of the workpiece W, and the heater 31 incorporated therein heats the workpiece W. With this heating operation, the heat-peelable adhesion layer 3b of the double-faced adhesive tape 3 is foamed and expanded, and its adhesion force becomes lost.

After completion of the heating operation for a predetermined time, as illustrated in FIG. 14B, the suction plate 28 moves upward while suction-holding the support board 2. In this case, the adhesion force of the adhesion layer 3c joined to the support board 2 is lowered by irradiation of ultraviolet rays. However, since the adhesion layer 3c has a larger adhesion force than that of the adhesion layer 3b, the support board 2 is separated from the semiconductor wafer 1 and is moved upward while the double-faced adhesive tape 3 is jointed thereto. Thereafter, the separated support board 2 with the double-faced adhesive tape 3 joined thereto is received by the first transporting robot 5 and, then, is transported to the support board collecting section 13. During this transporting operation, the suction head 5b is turned upside down, and the support board 2 is temporarily stored in the cassette of the support board collecting section 13 in such a posture that the double-faced adhesive tape 3 is directed upward.

After completion of the support board separating process, the holding table 9 holds only the semiconductor wafer 1 having the surface directed upward. The holding table 9 on and by which the semiconductor wafer 1 is mounted and held is moved to the peeling position of the adhesive tape peeling mechanism 11.

When the holding table 9 is moved to the peeling position of the adhesive tape peeling mechanism 11, the semiconductor wafer 1 is transported from the holding table 9 by the second transporting robot 6, and is inserted into and stored in the cassette of the wafer collecting section 14. In this case, since a Bernoulli chuck is employed as the suction head 6b of the second transporting robot 6, the top face of the semiconductor wafer 1 is suction-held by the suction head 6b in a non-contact manner. In addition, the semiconductor wafer 1 is transported while being kept at a flat state with its surface not being damaged.

The holding table 9 from which the semiconductor table 1 is transported returns and moves to its original position. At the same time, the support board 2 with the double-faced adhesive tape 3, temporarily stored in the support board collecting section 13, is taken out by the first transporting robot 5, and supplied onto and held by the holding table 9 returned and moved to its original position. Herein, the double-faced adhesive tape 3 is joined to the top face of the support board 2.

The holding table 9 holding the support board 2 with the double-faced adhesive tape 3 is moved to the peeling position of the adhesive tape peeling mechanism 11. Herein, the support board 2 is subjected to the same peeling process as that in the first embodiment.

Figure 15:
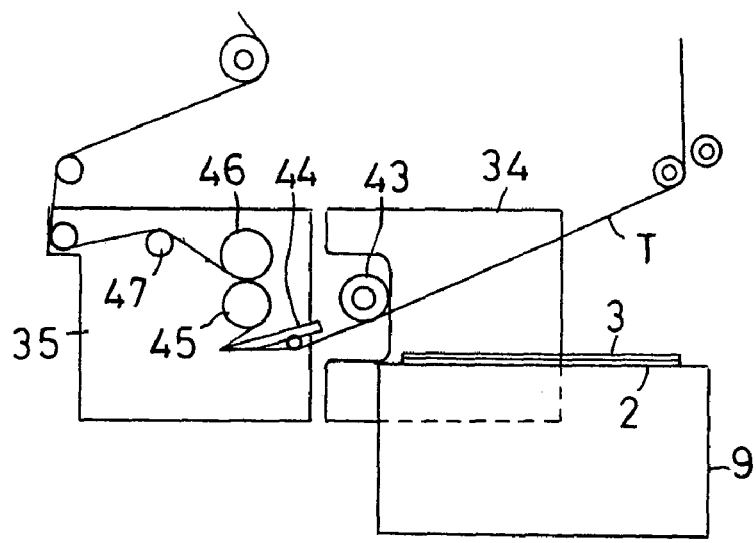
FIG. 15 is a front view illustrating a step of peeling off a double-faced adhesive tape in the second embodiment.
Figure 16:
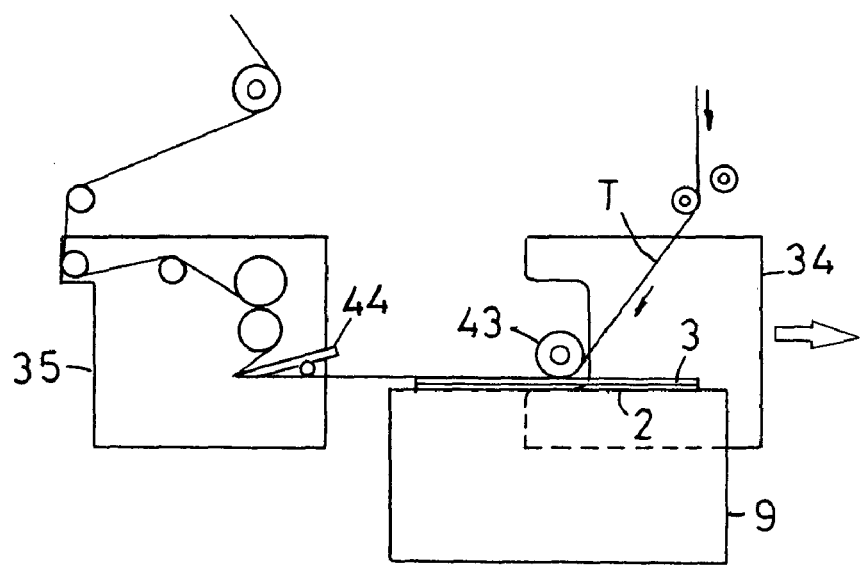
FIG. 16 is a front view illustrating a step of peeling off the double-faced adhesive tape in a second embodiment.
Figure 17:
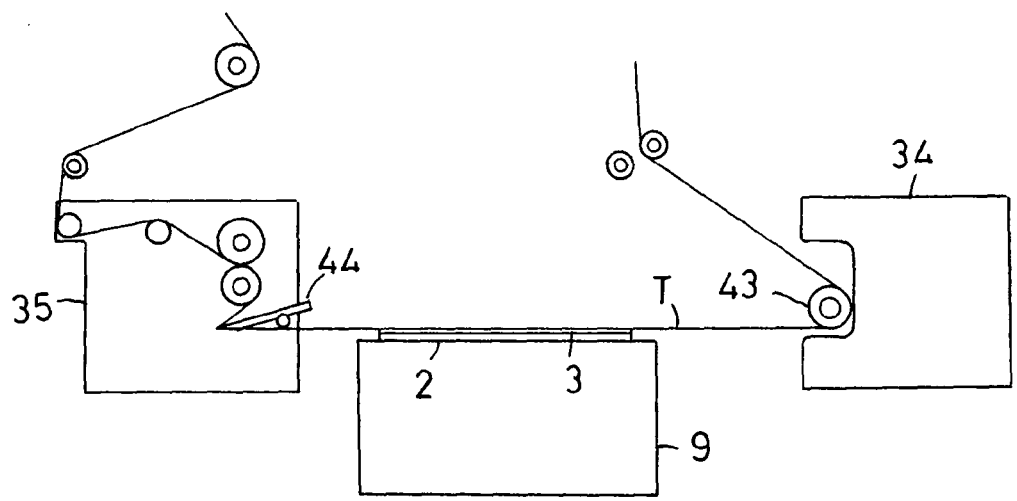
FIG. 17 is a front view illustrating a step of peeling off the double-faced adhesive tape in the second embodiment.

More specifically, at the time when the holding table 9 is moved to the peeling position, as illustrated in FIG. 15, the joining unit 34 and the peeling unit 35 are on standby at their initial positions. 1o When the holding table 9 reaches the peeling position, as illustrated in FIG. 16, the joining roller 43 moved downward presses the peeling tape T against the double-faced adhesive tape 3 and, simultaneously, the joining unit 34 moves forward. Then, as illustrated in FIG. 17, the joining unit 34 further moves forward while joining the peeling tape T to the top face of the double-faced adhesive tape 3, and stops at a predetermined position.

Figure 18:
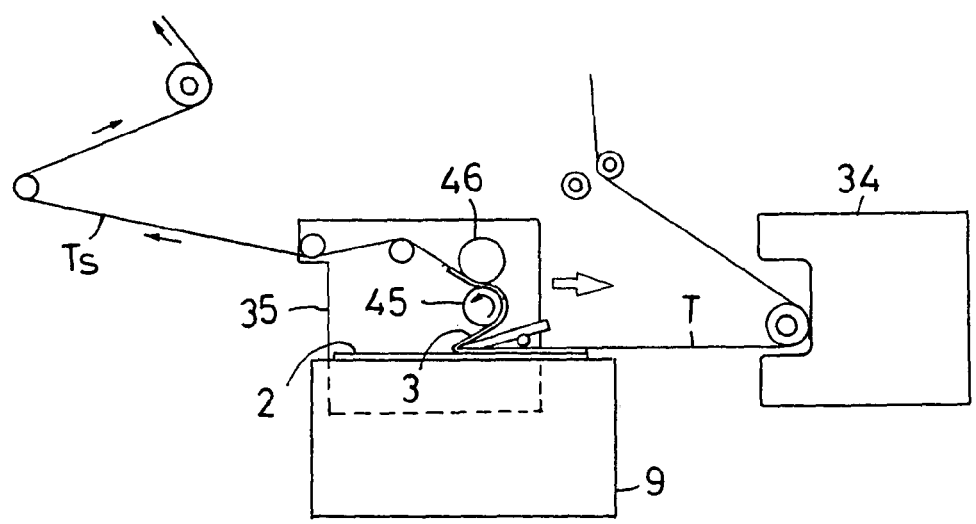
FIG. 18 is a front view illustrating a step of peeling off the double-faced adhesive tape in the second embodiment.

Next, as illustrated in FIG. 18, the peeling unit 35 moves forward while the edge member 44 is pressed against the double-faced adhesive tape 3 and, simultaneously, the feed roller 45 is driven and rotated at a peripheral speed which is in synchronization with a speed at which the peeling unit 35 moves. With this operation, the peeling tape T is moved while being folded back at the tip end of the edge member 44. Herein, the double-faced adhesive tape 3 having an adhesion force lowered by irradiation of ultraviolet rays is peeled off from the top face of the support board 2 together with the peeling tape T.

When the double-faced adhesive tape 3 is completely peeled off from the support board 2, the joining unit 34 and the peeling unit 35 retreat, return and move to their original standby positions and, also, the holding table 9 returns and moves to its original standby position.

When the holding table 9 holding the support board 2 returns to the standby position, the support board 2 is transported from the holding table 9 to the support board collecting section 13 by the first transporting robot 5, and is inserted into and stored in the cassette of the support board collecting section 13.

Thus, a series of procedures for separating and collecting the support board 2 and the semiconductor wafer 1 is completed, and the support board separating apparatus enters a standby state for accepting a next workpiece.

With the support board separating apparatus according to this embodiment, since the semiconductor wafer 1 can be immediately separated into a single piece by the separation of the support board 2, it is unnecessary to apply the double-faced adhesive tape peeling process to the semiconductor wafer 1. Accordingly, the semiconductor wafer 1 receives no external forces generated upon joining of the peeling tape T and upon peeling of the peeling tape T. As a result, it is possible to efficiently collect the semiconductor wafer 1 without being damaged and bent.

Herein, since the support board 2 can be optionally configured to have a higher strength than that of the semiconductor wafer 1, no problem arises even when a comparatively large external force is applied upon joining of the peeling tape T and upon peeling of the peeling tape T. Further, a peeling process at high speed can be performed without problems. In addition, the support board 2 can be made reusable in the apparatus. Therefore, it is unnecessary to transfer only the support board 2 to an independent site where a process for reuse is performed.

The present invention is not limited to the aforementioned embodiments, and may be carried out by the following modes.

(1) In the aforementioned embodiments, the double-faced adhesive tape 3 has the heat-peelable adhesion layer 3b and the ultraviolet-ray curable adhesion layer 3c. However, the adhesion layers 3b and 3c may be both of a heat-peelable type. In this case, it is desirable that adhesion force vanishing temperature of the respective adhesion layers 3b and 3c are differentiated from each other.

(2) In contrast, the adhesion layers 3b and 3c may be both of an ultraviolet-ray curable type. In this case, it is sufficient that wavelengths of ultraviolet rays at which the adhesion layers 3b and 3c are cured are differentiated from each other, so that characteristics for lowering or vanishing their adhesion forces are differentiated from each other.

The present invention may be embodied in other specific forms without departing from the spirit or essential attributes thereof and, accordingly, reference should be made to the appended claims, rather than to the foregoing specification, as indicating the scope of the invention.

What is claimed is:

1. An apparatus for separating, from a semiconductor wafer, a support board joined to the semiconductor wafer through a double-faced adhesive tape, the apparatus comprising:
    an aligner for aligning the semiconductor wafer to which the support board is joined;
    a holding table on and by which the aligned semiconductor wafer is mounted and held;
    a separating mechanism for losing adhesive force of either one surface of the double-faced adhesive tape having an adhesive layer on an opposite surface whose adhesive force becomes lost under a different condition from the adhesive layer on the one surface, remaining the double-faced adhesive tape on either a surface of the semiconductor wafer or the support board joined thereto, and separating the support board from the semiconductor wafer mounted on and held by the holding table;
    a peeling mechanism for peeling off and removing the double-faced adhesive tape laminated on either the surface of the support board separated by the separating mechanism or the surface of the semiconductor wafer;
    a wafer collecting section for collecting the semiconductor wafer that has been subjected to the peeling process by the peeling mechanism;
    a support board collecting section for collecting the separated support board; a first transporting robot capable of turning upside down and swinging the held support board when transporting the semiconductor wafer to the aligner and the separating mechanism and, also, transporting the separated support board to the holding table and the support board collecting section; and
    a second transporting robot capable of swinging for holding and transporting the semiconductor wafer that has been subjected to the peeling process;
    wherein the first transporting robot and the second transporting robot are placed in parallel on an apparatus base;
    the aligner, the separating mechanism, and the support board collecting section are arranged along a turning radius of the first transporting robot;
    the separating mechanism and the wafer collecting section are arranged along a turning radius of the second transporting robot; and
    the holding table reciprocates on a line connecting the separating mechanism with the peeling mechanism.

2. The apparatus of claim 1, wherein
the holding table is configured to move to a peeling position of the peeling mechanism while holding the separated semiconductor wafer or support board.

3. The apparatus of claim 1, wherein
the second transporting robot includes a Bernoulli chuck for transporting the semiconductor wafer in a non-contact manner with the use of a negative pressure generated by a difference between air blown on the surface of the semiconductor wafer and an atmospheric pressure.

4. The apparatus of claim 1, wherein
the support board is a transparent substrate, and
the double-faced adhesive tape includes a base material and adhesion layers at least one of which is of an ultraviolet-ray curable type,
the apparatus further comprising:
an ultraviolet-ray irradiating mechanism for irradiating, with ultraviolet rays, the support board joined to the semiconductor wafer through the double-faced adhesive tape.

5. The apparatus of claim 1, wherein
the support board is a transparent substrate, and
the double-faced adhesive tape includes a base material, an ultraviolet-ray curable adhesion layer provided on one side of the base material and cured at a predetermined wavelength of ultraviolet rays, and an ultraviolet curable adhesion layer provided on the other side of the base material and cured at a different wavelength from the predetermined wavelength,
the apparatus further comprising:
an ultraviolet-ray irradiating mechanism for curing the respective adhesion layers of the double-faced adhesive tape.

6. The apparatus of claim 1, wherein
the support board is a transparent substrate, and
the double-faced adhesive tape includes an ultraviolet ray curable adhesion layer to be joined to the support board, and a heat-peelable adhesion layer to be joined to the semiconductor layer and having an adhesion force lowered by heating,
the apparatus further comprising:
an ultraviolet-ray irradiating mechanism for irradiating, with ultraviolet rays, the support board joined to the semiconductor wafer through the double-faced adhesive tape; and
a heating mechanism for heating the heat-peelable adhesion layer.

7. The apparatus of claim 1, wherein
the double-faced adhesive tape includes a base material, a heat-peelable adhesion layer provided on one side of the base material and having an adhesion force lowered at a predetermined temperature, and a heat-peelable adhesion layer provided on the other side of the base material and having an adhesion force lowered at a different temperature from the predetermined temperature,
the apparatus further comprising:
a heating mechanism for heating the heat-peelable adhesion layer.

8. A method using the apparatus of claim 1, comprising:
a first transporting step of suction-holding a semiconductor wafer joined to a support board through a double-faced adhesive tape including a base material and adhesion layers provided on both sides of the base material with the use of the first transporting robot, and transferring the semiconductor wafer to the aligner;
an aligning step of aligning the semiconductor wafer with the use of the aligner;
a second transporting step of transferring the aligned semiconductor wafer to the holding table with the use of the first transporting robot;
a separating step of separating the support board from the semiconductor wafer held by the holding table while the double-faced adhesive tape is left on a surface of the semiconductor wafer;
a third transporting step of suction-holding, with the use of the first transporting robot, a bottom face of the support board separated while being turned upside down, and transporting and storing the support board to and in the support board collecting section;
a fourth transporting step of moving the semiconductor wafer separated from the support board to a peeling position of the peeling mechanism while the semiconductor wafer is held by the holding table;
a peeling step of joining a peeling tape to the surface of the base material and, then, peeling off the peeling tape with the use of the peeling mechanism, thereby peeling off the double-faced adhesive tape together with the peeling tape from the surface of the semiconductor wafer; and
a fifth transporting step of holding the semiconductor wafer from which the double-faced adhesive tape is peeled off with the use of the second transporting robot in a non-contact manner, thereby transporting and storing the semiconductor wafer to and in the wafer collecting section.

9. The method of claim 8, wherein
the support board is a transparent substrate,
the method further comprising:
an ultraviolet-ray irradiating step of irradiating the substrate with ultraviolet rays with the use of an ultraviolet-ray irradiating mechanism prior to the separating step.

10. The method of claim 8, wherein
in the separating step, further, the adhesion layers of the double-faced adhesive tape are heated by the heating mechanism.

11. The method of claim 8, wherein
the support board is a transparent substrate,
the method further comprising:
an ultraviolet-ray irradiating step of irradiating the substrate with ultraviolet rays with the use of an ultraviolet-ray irradiating mechanism prior to the separating step, wherein
in the separating step, the adhesion layers of the double-faced adhesive tape are heated by a heating mechanism.

12. A method using the apparatus of claim 1, comprising:
a first transporting step of suction-holding a semiconductor wafer joined to a support board through a double-faced adhesive tape including a base material and adhesion layers provided on both sides of the base material with the use of the first transporting robot, and transferring the semiconductor wafer to the aligner;
an aligning step of aligning the semiconductor wafer with the use of the aligner;
a second transporting step of transferring the aligned semiconductor wafer to the holding table with the use of the first transporting robot;
a separating step of separating the support board from the semiconductor wafer in a state that the double-faced adhesive tape is left on the support board;
a third transporting step of suction-holding, with the use of the first transporting robot, a top face of the support board separated and turning the support board upside down, thereby transporting and storing the support board to and in the support board collecting section in a state that the side to which the double-faced adhesive tape is directed upward;
a fourth transporting step of moving the semiconductor wafer separated from the support board to a peeling position by the peeling mechanism while the semiconductor wafer is held by the holding table;
a fifth transporting step of holding the semiconductor wafer transported to the peeling mechanism with the use of the second transporting robot in a non-contact manner and transporting and storing the semiconductor wafer to and in the wafer collecting section;
a returning step of allowing the holding table to which the semiconductor wafer is transported to return to the position of the separating mechanism;
a sixth transporting step of taking out the support board stored in the support board collecting section in such a manner that the first transporting robot suction-holds the bottom face of the support board, and transferring the support board to the returned holding table in a state that the adhesion face thereof is directed upward;

a seventh transporting step of moving the support board to the peeling position of the peeling mechanism while the support board is held by the holding table;

a peeling step of joining a peeling tape to the double-faced adhesive tape left on the support board, and peeling off the peeling tape with the use of the peeling mechanism, thereby peeling off the double-faced adhesive tape together with the peeling tape from the support board;

an eighth transporting step of allowing the holding table to return to the position of the separating mechanism while the holding table holds the support board from which the double-faced adhesive tape is peed off; and a ninth transporting step of suction-holding the support board held by the holding table returned to the position of the separating mechanism with the use of the first transporting robot, thereby transporting and storing the support board to and in the support board collecting section.

13. The method of claim 12, wherein
the support board is a transparent substrate,
the method further comprising:
an ultraviolet-ray irradiating step of irradiating the substrate with ultraviolet rays with the use of an ultraviolet-ray irradiating mechanism prior to the separating step.

14. The method of claim 12, wherein
in the separating step, further, the adhesion layers of the double-faced adhesive tape are heated by an heating mechanism.

15. The method of claim 12, wherein
the support board is a transparent substrate,
the method further comprising:
an ultraviolet-ray irradiating step of irradiating the substrate with ultraviolet rays with the use of an ultraviolet-ray irradiating mechanism prior to the separating step, wherein
in the separating step, the adhesion layers of the double-faced adhesive tape are heated by an heating mechanism.

* * * * *